(12) United States Patent
Law et al.

(10) Patent No.: US 6,869,838 B2
(45) Date of Patent: Mar. 22, 2005

(54) DEPOSITION OF PASSIVATION LAYERS FOR ACTIVE MATRIX LIQUID CRYSTAL DISPLAY (AMLCD) APPLICATIONS

(75) Inventors: Kam Law, Union City, CA (US); Quanyuan Shang, Saratoga, CA (US); William Reid Harshbarger, San Jose, CA (US); Dan Maydan, Los Altos Hills, CA (US)

(73) Assignee: Applied Materials, Inc., Santa Clara, CA (US)

( * ) Notice: Subject to any disclaimer, the term of this patent is extended or adjusted under 35 U.S.C. 154(b) by 274 days.

(21) Appl. No.: 10/118,864

(22) Filed: Apr. 9, 2002

(65) Prior Publication Data

US 2003/0189232 A1 Oct. 9, 2003

(51) Int. Cl.$^7$ .............................................. H01L 27/10
(52) U.S. Cl. ...................... 438/207; 438/612; 438/243; 438/386; 257/374
(58) Field of Search .............................. 438/612, 243, 438/207, 386; 257/374

(56) References Cited

U.S. PATENT DOCUMENTS

| | | | |
|---|---|---|---|
| 4,058,430 A | 11/1977 | Suntola et al. | 156/611 |
| 4,389,973 A | 6/1983 | Suntola et al. | 118/725 |
| 4,413,022 A | 11/1983 | Suntola et al. | 427/255.2 |
| 4,486,487 A | 12/1984 | Skarp | 428/216 |
| 4,767,494 A | 8/1988 | Kobayashi et al. | 156/606 |
| 4,806,321 A | 2/1989 | Nishizawa et al. | 422/245 |
| 4,813,846 A | 3/1989 | Helms | 414/744.1 |
| 4,829,022 A | 5/1989 | Kobayashi et al. | 437/107 |
| 4,834,831 A | 5/1989 | Nishizawa et al. | 156/611 |
| 4,838,983 A | 6/1989 | Schumaker et al. | 156/613 |
| 4,838,993 A | 6/1989 | Aoki et al. | 156/643 |
| 4,840,921 A | 6/1989 | Matsumoto | 437/89 |
| 4,845,049 A | 7/1989 | Sunakawa | 437/81 |
| 4,859,625 A | 8/1989 | Nishizawa et al. | 437/81 |
| 4,859,627 A | 8/1989 | Sunakawa | 437/81 |
| 4,861,417 A | 8/1989 | Mochizuki et al. | 156/610 |
| 4,876,218 A | 10/1989 | Pessa et al. | 437/107 |
| 4,917,556 A | 4/1990 | Stark et al. | 414/217 |
| 4,927,670 A | 5/1990 | Erbil | 427/255.3 |
| 4,931,132 A | 6/1990 | Aspnes et al. | 156/601 |
| 4,951,601 A | 8/1990 | Maydan et al. | 118/719 |
| 4,960,720 A | 10/1990 | Shimbo | 437/105 |
| 4,975,252 A | 12/1990 | Nishizawa et al. | 422/245 |
| 4,993,357 A | 2/1991 | Scholz | 118/715 |
| 5,000,113 A | 3/1991 | Wang et al. | 118/723 |
| 5,013,683 A | 5/1991 | Petroff et al. | 437/110 |
| 5,028,565 A | 7/1991 | Chang et al. | 437/192 |
| 5,082,798 A | 1/1992 | Arimoto | 437/108 |
| 5,085,885 A | 2/1992 | Foley et al. | 477/38 |
| 5,091,320 A | 2/1992 | Aspnes et al. | 437/8 |
| 5,130,269 A | 7/1992 | Kitahara et al. | 437/111 |
| 5,166,092 A | 11/1992 | Mochizuki et al. | 437/105 |
| 5,173,474 A | 12/1992 | Connell et al. | 505/1 |
| 5,186,718 A | 2/1993 | Tepman et al. | 29/25.01 |
| 5,205,077 A | 4/1993 | Wittstock | 51/165 R |
| 5,225,366 A | 7/1993 | Yoder | 437/108 |
| 5,234,561 A | 8/1993 | Randhawa et al. | 204/192.38 |
| 5,246,536 A | 9/1993 | Nishizawa et al. | 156/610 |
| 5,250,148 A | 10/1993 | Nishizawa et al. | 156/611 |

(List continued on next page.)

OTHER PUBLICATIONS

PCT Search Report dated Feb. 17, 2004; PCT/US 10928.

*Primary Examiner*—Fetsum Abraham
(74) *Attorney, Agent, or Firm*—Moser, Patterson & Sheridan LLP

(57) ABSTRACT

A method of passivation layer deposition using a cyclical deposition process is described. The cyclical deposition process may comprise alternately adsorbing a silicon-containing precursor and a reactant gas on a substrate structure. Thin film transistors, such as a bottom-gate transistor or a top-gate transistor, including a silicon-containing passivation layer, may be formed using such cyclical deposition techniques.

14 Claims, 6 Drawing Sheets

U.S. PATENT DOCUMENTS

| | | | |
|---|---|---|---|
| 5,254,207 A | 10/1993 | Nishizawa et al. | 156/601 |
| 5,256,244 A | 10/1993 | Ackerman | 156/613 |
| 5,259,881 A | 11/1993 | Edwards et al. | 118/719 |
| 5,270,247 A | 12/1993 | Sakuma et al. | 437/133 |
| 5,278,435 A | 1/1994 | Van Hove et al. | 257/184 |
| 5,281,274 A | 1/1994 | Yoder | 118/697 |
| 5,286,296 A | 2/1994 | Sato et al. | 118/719 |
| 5,290,748 A | 3/1994 | Knuuttila et al. | 502/228 |
| 5,294,286 A | 3/1994 | Nishizawa et al. | 156/610 |
| 5,296,403 A | 3/1994 | Nishizawa et al. | 437/133 |
| 5,300,186 A | 4/1994 | Kitahara et al. | 156/613 |
| 5,311,055 A | 5/1994 | Goodman et al. | 257/593 |
| 5,316,615 A | 5/1994 | Copel | 117/95 |
| 5,316,793 A | 5/1994 | Wallace et al. | 427/248.1 |
| 5,330,610 A | 7/1994 | Eres et al. | 117/86 |
| 5,336,324 A | 8/1994 | Stall et al. | 118/719 |
| 5,338,389 A | 8/1994 | Nishizawa et al. | 117/89 |
| 5,348,911 A | 9/1994 | Jurgensen et al. | 117/91 |
| 5,374,570 A | 12/1994 | Nasu et al. | 437/40 |
| 5,395,791 A | 3/1995 | Cheng et al. | 437/105 |
| 5,438,952 A | 8/1995 | Otsuka | 117/84 |
| 5,439,876 A | 8/1995 | Graf et al. | 505/447 |
| 5,441,703 A | 8/1995 | Jurgensen | 422/129 |
| 5,443,033 A | 8/1995 | Nishizawa et al. | 117/86 |
| 5,443,647 A | 8/1995 | Aucoin et al. | 118/723 ME |
| 5,455,072 A | 10/1995 | Bension et al. | 427/255.7 |
| 5,458,084 A | 10/1995 | Thorne et al. | 117/89 |
| 5,469,806 A | 11/1995 | Mochizuki et al. | 117/97 |
| 5,480,818 A | 1/1996 | Matsumoto et al. | 437/40 |
| 5,483,919 A | 1/1996 | Yokoyama et al. | 117/89 |
| 5,484,664 A | 1/1996 | Kitahara et al. | 428/641 |
| 5,503,875 A | 4/1996 | Imai et al. | 427/255.3 |
| 5,521,126 A | 5/1996 | Okamura et al. | 437/235 |
| 5,527,733 A | 6/1996 | Nishizawa et al. | 437/160 |
| 5,532,511 A | 7/1996 | Nishizawa et al. | 257/627 |
| 5,540,783 A | 7/1996 | Eres et al. | 118/725 |
| 5,580,380 A | 12/1996 | Liu et al. | 117/86 |
| 5,601,651 A | 2/1997 | Watabe | 118/715 |
| 5,609,689 A | 3/1997 | Kato et al. | 118/719 |
| 5,616,181 A | 4/1997 | Yamamoto et al. | 118/723 ER |
| 5,637,530 A | 6/1997 | Gaines et al. | 114/105 |
| 5,641,984 A | 6/1997 | Aftergut et al. | 257/433 |
| 5,644,128 A | 7/1997 | Wollnik et al. | 250/251 |
| 5,667,592 A | 9/1997 | Boitnott et al. | 118/719 |
| 5,674,786 A | 10/1997 | Turner et al. | 437/225 |
| 5,693,139 A | 12/1997 | Nishizawa et al. | 117/89 |
| 5,695,564 A | 12/1997 | Imahashi | 118/719 |
| 5,705,224 A | 1/1998 | Murota et al. | 427/248.1 |
| 5,707,880 A | 1/1998 | Aftergut et al. | 437/3 |
| 5,711,811 A | 1/1998 | Suntola et al. | 118/711 |
| 5,730,801 A | 3/1998 | Tepman et al. | 118/719 |
| 5,730,802 A | 3/1998 | Ishizumi et al. | 118/719 |
| 5,747,113 A | 5/1998 | Tsai | 427/255.5 |
| 5,749,974 A | 5/1998 | Habuka et al. | 118/725 |
| 5,788,447 A | 8/1998 | Yonemitsu et al. | 414/217 |
| 5,788,799 A | 8/1998 | Steger et al. | 156/345 |
| 5,796,116 A | 8/1998 | Nakata et al. | 257/66 |
| 5,801,634 A | 9/1998 | Young et al. | 340/635 |
| 5,807,792 A | 9/1998 | Ilg et al. | 438/758 |
| 5,830,270 A | 11/1998 | McKee et al. | 117/106 |
| 5,835,677 A | 11/1998 | Li et al. | 392/401 |
| 5,851,849 A | 12/1998 | Comizzoli et al. | 438/38 |
| 5,855,675 A | 1/1999 | Doering et al. | 118/719 |
| 5,855,680 A | 1/1999 | Soininen et al. | 118/719 |
| 5,856,219 A | 1/1999 | Naito et al. | 438/241 |
| 5,858,102 A | 1/1999 | Tsai | 118/719 |
| 5,866,213 A | 2/1999 | Foster et al. | 427/573 |
| 5,866,795 A | 2/1999 | Wang et al. | 73/1.36 |
| 5,879,459 A | 3/1999 | Gadgil et al. | 118/715 |
| 5,882,165 A | 3/1999 | Maydan et al. | 414/217 |
| 5,882,413 A | 3/1999 | Beaulieu et al. | 118/719 |
| 5,904,565 A | 5/1999 | Nguyen et al. | 438/687 |
| 5,916,365 A | 6/1999 | Sherman | 117/92 |
| 5,923,056 A | 7/1999 | Lee et al. | 257/192 |
| 5,923,985 A | 7/1999 | Aoki et al. | 438/301 |
| 5,925,574 A | 7/1999 | Aoki et al. | 437/31 |
| 5,928,389 A | 7/1999 | Jevtic | 29/25.01 |
| 5,942,040 A | 8/1999 | Kim et al. | 118/726 |
| 5,947,710 A | 9/1999 | Cooper et al. | 418/63 |
| 5,972,430 A | 10/1999 | DiMeo, Jr. et al. | 427/255.32 |
| 6,001,669 A | 12/1999 | Gaines et al. | 438/102 |
| 6,015,590 A | 1/2000 | Suntola et al. | 427/255.23 |
| 6,025,627 A | 2/2000 | Forbes et al. | 257/321 |
| 6,036,773 A | 3/2000 | Wang et al. | 117/97 |
| 6,042,652 A | 3/2000 | Hyun et al. | 118/719 |
| 6,043,177 A | 3/2000 | Falconer et al. | 502/4 |
| 6,051,286 A | 4/2000 | Zhao et al. | 427/576 |
| 6,062,798 A | 5/2000 | Muka | 414/416 |
| 6,071,808 A | 6/2000 | Merchant et al. | 438/633 |
| 6,084,302 A | 7/2000 | Sandhu | 257/751 |
| 6,086,677 A | 7/2000 | Umotoy et al. | 118/715 |
| 6,110,556 A | 8/2000 | Bang et al. | 428/64.1 |
| 6,113,977 A | 9/2000 | Soininen et al. | 427/64 |
| 6,117,244 A | 9/2000 | Bang et al. | 118/715 |
| 6,124,158 A | 9/2000 | Dautartas et al. | 438/216 |
| 6,130,147 A | 10/2000 | Major et al. | 438/604 |
| 6,139,700 A | 10/2000 | Kang et al. | 204/192.17 |
| 6,140,237 A | 10/2000 | Chan et al. | 438/687 |
| 6,140,238 A | 10/2000 | Kitch | 438/687 |
| 6,143,659 A | 11/2000 | Leem | 438/688 |
| 6,144,060 A | 11/2000 | Park et al. | 257/310 |
| 6,158,446 A | 12/2000 | Mohindra et al. | 134/25.4 |
| 6,174,377 B1 | 1/2001 | Doering et al. | 118/729 |
| 6,174,809 B1 | 1/2001 | Kang et al. | 438/682 |
| 6,200,893 B1 | 3/2001 | Sneh | 438/685 |
| 6,203,613 B1 | 3/2001 | Gates et al. | 117/104 |
| 6,206,967 B1 | 3/2001 | Mak et al. | 118/666 |
| 6,207,302 B1 | 3/2001 | Sugiura et al. | 428/690 |
| 6,248,605 B1 | 6/2001 | Harkonen et al. | 438/29 |
| 6,270,572 B1 | 8/2001 | Kim et al. | 117/93 |
| 6,271,148 B1 | 8/2001 | Kao et al. | 438/727 |
| 6,287,965 B1 | 9/2001 | Kang et al. | 438/648 |
| 6,291,876 B1 | 9/2001 | Stumborg et al. | 257/632 |
| 6,305,314 B1 | 10/2001 | Sneh et al. | 118/723 R |
| 6,306,216 B1 | 10/2001 | Kim et al. | 118/725 |
| 6,316,098 B1 | 11/2001 | Yitzchaik et al. | 428/339 |
| 2001/0000866 A1 | 5/2001 | Sneh et al. | 118/723 R |
| 2001/0009140 A1 | 7/2001 | Bondeslam et al. | 118/725 |
| 2001/0011526 A1 | 8/2001 | Doering et al. | 118/729 |
| 2001/0031562 A1 | 10/2001 | Raaijmakers et al. | 438/770 |
| 2001/0034123 A1 | 10/2001 | Jeon et al. | 438/643 |
| 2001/0041250 A1 | 11/2001 | Werkhoven et al. | 428/212 |
| 2001/0042799 A1 | 11/2001 | Kim et al. | 239/553 |

DEPOSITION OF PASSIVATION LAYERS FOR ACTIVE MATRIX LIQUID CRYSTAL DISPLAY (AMLCD) APPLICATIONS

BACKGROUND OF THE INVENTION

1. Field of the Invention

Embodiments of the present invention relate to methods of passivation layer deposition and, more particularly to methods of passivation layer formation using cyclical deposition techniques for active matrix liquid crystal display applications.

2. Description of the Background Art

Active matrix liquid crystal displays have eliminated many problems associated with passive displays. For example, the fabrication of Active matrix liquid crystal displays have enabled display screens to achieve greater brightness, enhanced readability, a greater variety of color shades, and broader viewing angles compared to displays that employ other technologies. Active matrix liquid crystal displays have therefore become the display technology of choice for numerous applications including computer monitors, television screens, camera displays, avionics displays, as well as numerous other applications.

Active matrix liquid crystal displays generally comprise an array of picture elements called pixels. An electronic switch is associated with each pixel in the display to control the operation thereof. Various electronic switches such as, for example, thin film transistors and organic light emitting diodes (OLED), among others have been investigated to control pixel operation. Thin film transistors, in particular, offer a high degree of design flexibility and device performance.

Thin film transistors are generally formed on large area substrates having a high degree of optical transparency such as, for example, glass. FIG. 1 depicts a cross-sectional schematic view of a thin film transistor (TFT) 22 being a type that has a bottom gate structure. The thin film transistor 22 includes a glass substrate 1 having an underlayer 2 formed on the surface thereof. A gate is formed on the underlayer 2. The gate comprises a gate metal layer 4 and a gate dielectric layer 8. The gate controls the movement of charge carriers in the transistor. A gate dielectric layer 8 formed over the gate metal layer 4 electrically isolates the gate from semiconductor layers 10, 14a, 14b, formed thereon, each of which may function to provide charge carriers to the transistor. A source region 18a of the transistor is formed on semiconductor layer 14a and a drain region 18b of the transistor is formed on semiconductor layer 14b. Finally, a passivation layer 20 encapsulates the thin film transistor 22 to protect it from environmental hazards such as moisture and oxygen.

The passivation layer 20 generally comprises a dielectric material, deposited using conventional techniques, such as, for example, plasma assisted chemical vapor deposition (PECVD). Unfortunately, it is difficult to deposit passivation layers that are continuous (e.g., without gaps or voids) using PECVD techniques. Furthermore, many conventional plasma assisted chemical vapor deposition (PECVD) techniques used to form passivation layers tend to be high temperature processes. High deposition temperatures may not be compatible with the glass substrates upon which the thin film transistors are formed, since the glass may soften and become dimensionally unstable.

Therefore, a need exists to develop a method of forming passivation layers for use in thin film transistors.

SUMMARY OF THE INVENTION

A method of passivation layer deposition for thin film transistor (TFT) applications for use in active matrix liquid crystal displays (AMLCD) is described. The passivation layer may be a silicon-containing passivation layer. The silicon-containing passivation layer may be deposited using a cyclical deposition process. The cyclical deposition process may comprise alternately adsorbing a silicon-containing precursor and a reactant gas on a substrate structure. The adsorbed silicon-containing precursor reacts with the reactant gas to form the silicon-containing passivation layer on the substrate.

Thin film transistors, such as for example a bottom-gate transistor or a top-gate transistor, including one or more passivation layers may be formed using such cyclical deposition techniques. In one embodiment, a preferred process sequence for fabricating a bottom-gate transistor includes providing a substrate having a gate comprising a gate metal layer and a gate dielectric layer formed thereon. One or more semiconducting layers with adjoining contact regions are formed on the gate dielectric layer. The bottom-gate transistor is completed by depositing a silicon-containing passivation layer over the contact regions and semiconducting layers formed on the substrate. The silicon-containing passivation layer may be formed by alternately adsorbing a silicon-containing precursor and a reactant gas on the substrate. The adsorbed silicon-containing precursor reacts with the adsorbed reactant gas to form the silicon-containing passivation layer on the substrate.

BRIEF DESCRIPTION OF THE DRAWINGS

So that the manner in which the above recited features of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Figure 1:
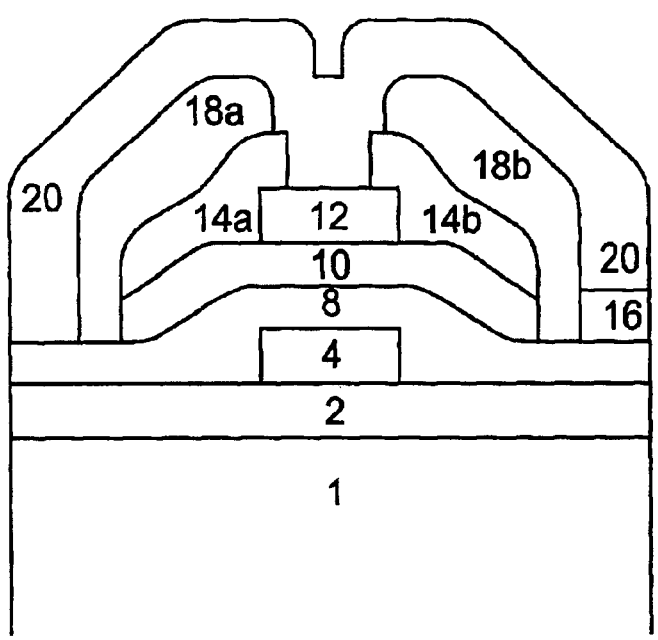
FIG. 1 depicts a cross-sectional schematic view of a prior art bottom-gate thin film transistor (TFT)
Figure 2:
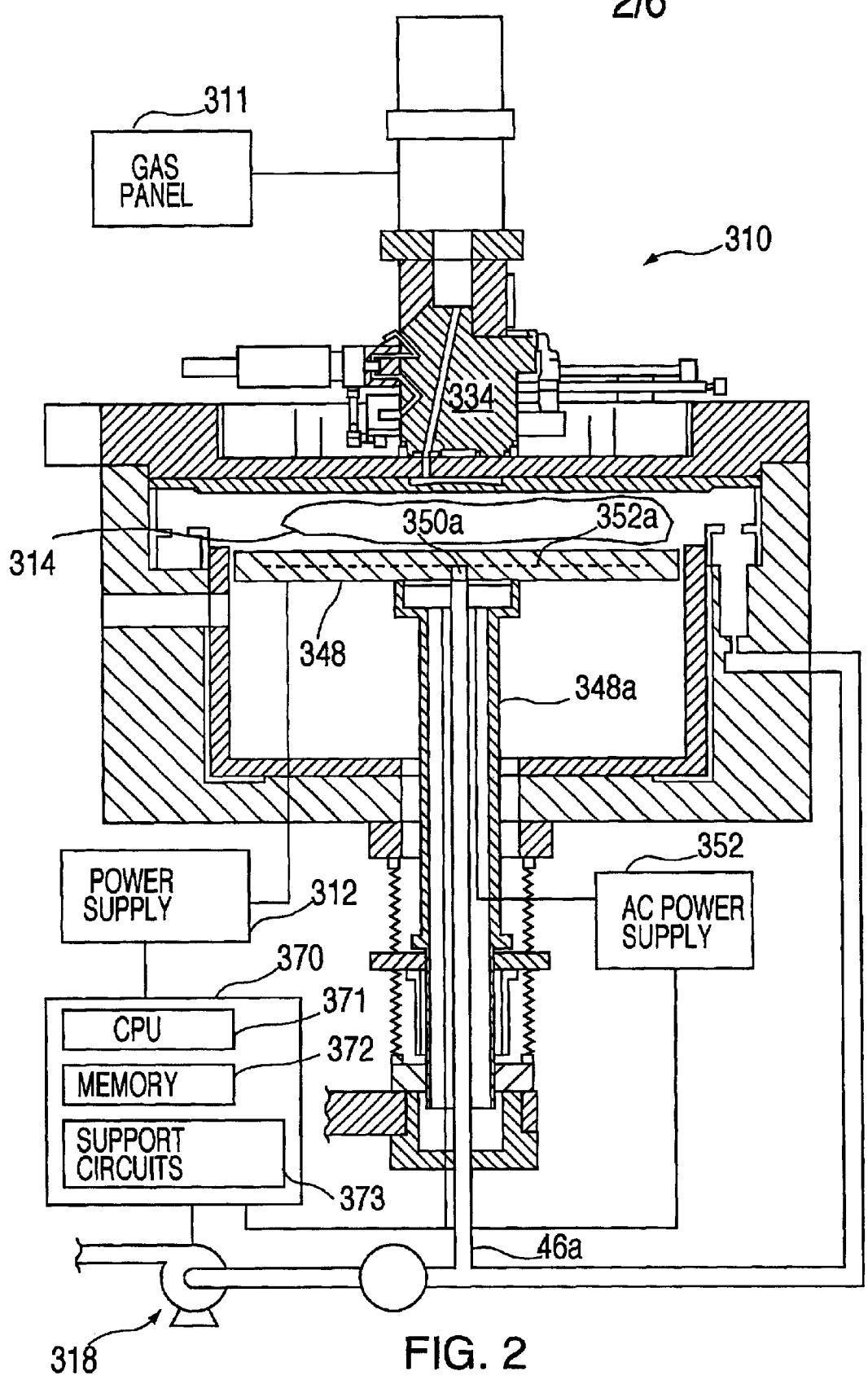
FIG. 2 depicts a schematic, cross-sectional view of a process chamber that can be used to practice embodiments described herein.

FIG. 2 depicts a schematic cross-sectional view of a process chamber 310 that can be used to perform integrated circuit fabrication in accordance with embodiments described herein. The process chamber 310 generally houses a substrate support pedestal 348, which is used to support a substrate (not shown). The substrate support pedestal 348 is movable in a vertical direction inside the process chamber 310 using a displacement mechanism 348a.

Depending on the specific process, the substrate can be heated to some desired temperature prior to or during deposition. For example, the substrate support pedestal 348 may be heated using an embedded heater element 352a. The substrate support pedestal 348 may be resistively heated by applying an electric current from an AC power supply 352 to the heater element 352a. The substrate (not shown) is, in turn, heated by the pedestal 348. Alternatively, the substrate support pedestal 348 may be heated using radiant heaters such as, for example, lamps (not shown).

A temperature sensor 350a, such as a thermocouple, is also embedded in the substrate support pedestal 348 to monitor the temperature of the pedestal 348 in a conventional manner. The measured temperature is used in a feedback loop to control the AC power supply 352 for the heating element 352a, such that the substrate temperature can be maintained or controlled at a desired temperature which is suitable for the particular process application.

A vacuum pump 318 is used to evacuate the process chamber 310 and to maintain the pressure inside the process chamber 310. A gas manifold 334, through which process gases are introduced into the process chamber 310, is located above the substrate support pedestal 348. The gas manifold 334 is connected to a gas panel 311, which controls and supplies various process gases to the process chamber 310.

Proper control and regulation of the gas flows to the gas manifold 334 are performed by mass flow controllers (not shown) and a microprocessor controller 370. The gas manifold 334 allows process gases to be introduced and uniformly distributed in the process chamber 310. Additionally, the gas manifold 334 may optionally be heated to prevent condensation of the any reactive gases within the manifold.

The gas manifold 334 includes a plurality of electronic control valves (not shown). The electronic control valves as used herein refer to any control valve capable of providing rapid and precise gas flow to the process chamber 310 with valve open and close cycles of less than about 1–2 seconds, and more preferably less than about 0.1 second.

The microprocessor controller 370 may be one of any form of general purpose computer processor (CPU) 371 that can be used in an industrial setting for controlling various chambers and sub-processors. The computer may use any suitable memory 372, such as random access memory, read only memory, floppy disk drive, hard disk, or any other form of digital storage, local or remote. Various support circuits 373 may be coupled to the CPU for supporting the processor in a conventional manner. Software routines as required may be stored on the memory or executed by a second CPU that is remotely located.

The software routines are executed to initiate process recipes or sequences. The software routines, when executed, transform the general purpose computer into a specific process computer that controls the chamber operation so that a chamber process is performed. For example, software routines may be used to precisely control the activation of the electronic control valves for the execution of process sequences according to the present invention. Alternatively, the software routines may be performed in hardware, as an application specific integrated circuit or other type of hardware implementation, or a combination of software or hardware.

Alternatively, process chamber 310 may be adapted to generate an electric field therein. The electric field may be applied to one or more of the process gases introduced into the process chamber 310 through the gas manifold 334. For example, a high frequency power supply 312 may be coupled to the substrate support pedestal 348. The high frequency power supply 312 may be a radio frequency (RF) power supply with a frequency of, for example, about 13.56 MHz.

An electric field may be generated within the process chamber 310 by applying a high frequency power to the substrate support pedestal 348. The electric field may be used to ignite a process gas, such as, for example a reactant gas, forming a plasma 314 within the process chamber 310. The plasma 314 is believed to enhance the reaction between absorbed process gases on a substrate positioned on the substrate support pedestal 348. The plasma may optionally be generated in a remote plasma chamber (not shown) that may then be introduced into the process chamber 310 through the gas manifold 334.

Passivation Layer Formation

A method of passivation layer deposition for thin film transistor (TFT) applications is described. A silicon-containing passivation layer is deposited using a cyclical deposition process. The cyclical deposition process may comprise alternately adsorbing a silicon-containing precursor and a reactant gas on a substrate structure. The silicon-containing precursor reacts with the reactant gas to form the silicon-containing passivation layer on the substrate. The silicon-containing passivation layer may comprise, for example, silicon nitride ($Si_3N_4$), silicon oxide (SiO) and silicon dioxide ($SiO_2$), among others.

Figure 3:
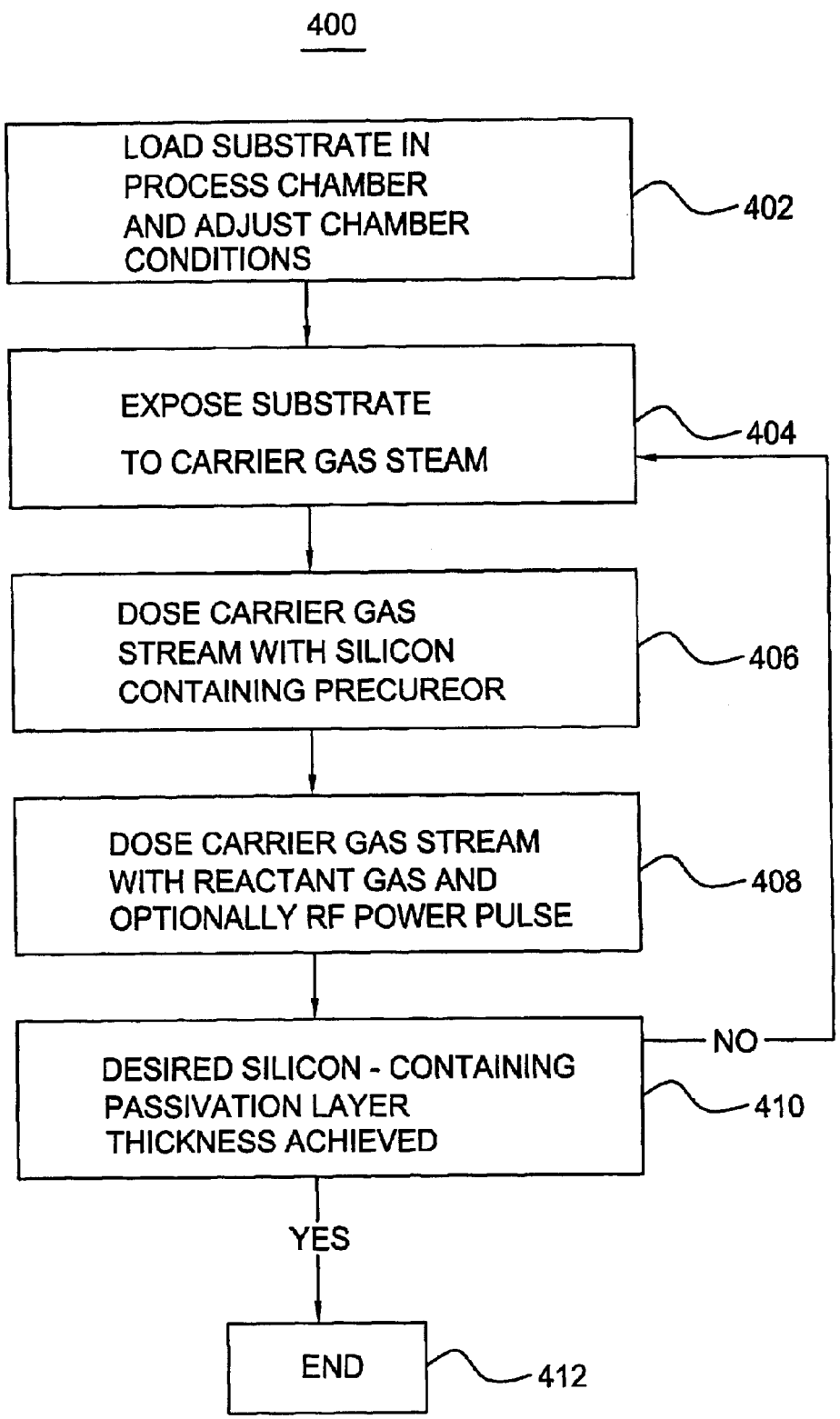
FIG. 3 illustrates a process sequence for passivation layer formation using cyclical deposition techniques according to one embodiment described herein.

FIG. 3 illustrates a process sequence 400 detailing the various steps used for the deposition of the silicon-containing passivation layer. These steps may be performed in a process chamber similar to that described above with reference to FIG. 2. As shown in step 402, a substrate is provided to the process chamber. The substrate may be for example, a glass or clear plastic material suitable for AMLCD fabrication. The process chamber conditions such as, for example, the temperature and pressure are adjusted to enhance the adsorption of the process gases on the substrate to facilitate the reaction of the silicon-containing precursor and the reactant gas. In general, for silicon-containing passivation layer deposition, the substrate should be maintained at a temperature less than about 500° C. at a process chamber pressure of between about 10 millitorr and about 10 torr.

In one embodiment where a constant carrier gas flow is desired, a carrier gas stream is established within the process chamber as indicated in step 404. Carrier gases may be selected so as to also act as a purge gas for removal of volatile reactants and/or by-products from the process chamber. Carrier gases such as, for example, helium (He), argon (Ar), and combinations thereof, may be used.

Referring to step 406, after the carrier gas stream is established within the process chamber, a pulse of a silicon-containing precursor is added to the carrier gas stream. The term pulse as used herein refers to a dose of material injected into the process chamber or into the carrier gas stream. The pulse of the silicon-containing precursor lasts for a predetermined time interval. The silicon-containing precursor may comprise, for example, silane ($SiH_4$), disilane ($Si_2H_6$), silicon tetrachloride ($SiCl_4$), dichlorosilane ($Si_2Cl_2H_2$,) and trichlorosilane ($SiCl_3H$), among others.

The time interval for the pulse of the silicon-containing precursor is variable depending upon a number of factors such as, for example, the volume capacity of the process chamber employed, the vacuum system coupled thereto and the volatility/reactivity of the reactants used. For example, (1) a large-volume process chamber may lead to a longer time to stabilize the process conditions such as, for example, carrier/purge gas flow and temperature, requiring a longer pulse time; (2) a lower flow rate for the process gas may also lead to a longer time to stabilize the process conditions requiring a longer pulse time; and (3) a lower chamber pressure means that the process gas is evacuated from the process chamber more quickly requiring a longer pulse time. In general, the process conditions are advantageously selected so that a pulse of the silicon-containing precursor provides a sufficient amount of precursor so that at least a monolayer of the silicon-containing precursor is adsorbed on the substrate. Thereafter, excess silicon-containing precursor remaining in the chamber may be removed from the process chamber by the constant carrier gas stream in combination with the vacuum system.

In step 408, after the excess silicon-containing precursor has been sufficiently removed from the process chamber by the carrier gas stream to prevent co-reaction or particle formation with a subsequently provided process gas, a pulse of a reactant gas is added to the carrier gas stream. Suitable reactant gases may include, for example, ammonia ($NH_3$), hydrazine ($N_2H_4$), nitrogen ($N_2$) and combinations thereof, among others for the deposition of silicon nitride layers. Suitable reactant gases may also include oxygen ($O_2$), ozone ($O_3$), hydrogen ($H_2$), water vapor ($H_2O$) and combinations thereof, among others for the deposition of silicon oxide layers.

The pulse of the reactant gas also lasts for a predetermined time interval. In general, the time interval for the pulse of the reactant gas should be long enough to provide a sufficient amount of the reactant gas for reaction with the silicon-containing precursor that is already adsorbed on the substrate. Thereafter, excess reactant gas is flushed from the process chamber by the carrier gas stream.

Alternatively, a high frequency power, such as an RF power, may be applied to the substrate support pedestal 348 (FIG. 2) coincident with the pulse of the reactant gas (step 408) to generate a plasma comprising the reactant gas within the process chamber. The plasma is believed to enhance the reaction between the adsorbed silicon-containing precursor on the substrate and the reactant gas. The application of the high frequency power to the substrate support chamber may last for the same predetermined time interval as the time interval for the pulse of the reactant gas. In general, for silicon-containing passivation layer deposition, a high frequency power of about 0.05 $W/mm^2$ (Watts/square millimeter) to about 2 $W/mm^2$ may be applied to the substrate support pedestal.

Steps 404 through 408 comprise one embodiment of a deposition cycle for a silicon-containing passivation layer. For such an embodiment, a constant flow of carrier gas is provided to the process chamber modulated by alternating periods of pulsing and non-pulsing where the periods of pulsing alternate between the silicon-containing precursor and the reactant gas along with the carrier gas stream, while the periods of non-pulsing include only the carrier gas stream.

The time interval for each of the pulses of the silicon-containing precursor and the reactant gas may have the same duration. That is the duration of the pulse of the silicon-containing precursor may be identical to the duration of the pulse of the reactant gas. For such an embodiment, a time interval ($T_1$) for the pulse of the silicon-containing precursor is equal to a time interval ($T_2$) for the pulse of the reactant gas.

Alternatively, the time interval for each of the pulses of the silicon-containing precursor and the reactant gas may have different durations. That is the duration of the pulse of the silicon-containing precursor may be shorter or longer than the duration of the pulse of the reactant gas. For such an embodiment, a time interval ($T_1$) for the pulse of the silicon-containing precursor is different than a time interval ($T_2$) for the pulse of the reactant gas.

In addition, the periods of non-pulsing between each of the pulses of the silicon-containing precursor and the reactant gas may have the same duration. That is the duration of the period of non-pulsing between each pulse of the silicon-containing precursor and each pulse of the reactant gas is identical. For such an embodiment, a time interval ($T_3$) of non-pulsing between the pulse of the silicon-containing precursor and the pulse of the reactant gas is equal to a time interval ($T_4$) of non-pulsing between the pulse of the reactant gas and the pulse of the silicon-containing precursor. During the time periods of non-pulsing only the constant carrier gas stream is provided to the process chamber.

Alternatively, the periods of non-pulsing between each of the pulses of the silicon-containing precursor and the reactant gas may have different durations. That is the duration of the period of non-pulsing between each pulse of the silicon-containing precursor and each pulse of the reactant gas may be shorter or longer than the duration of the period of non-pulsing between each pulse of the reactant gas and the silicon-containing precursor. For such an embodiment, a time interval ($T_3$) of non-pulsing between the pulse of the silicon-containing precursor and the pulse of the reactant gas is different from a time interval ($T_4$) of non-pulsing between the pulse of the reactant gas and the pulse of the silicon-containing precursor. During the time periods of non-pulsing only the constant carrier gas stream is provided to the process chamber.

Additionally, the time intervals for each pulse of the silicon-containing precursor, the reactant gas and the periods of non-pulsing therebetween for each deposition cycle may have the same duration. For such an embodiment, a time interval ($T_1$) for the silicon-containing precursor, a time interval ($T_2$) for the reactant gas, a time interval ($T_3$) of non-pulsing between the pulse of the silicon-containing precursor and the pulse of the reactant gas and a time interval ($T_4$) of non-pulsing between the pulse of the reactant gas and the pulse of the silicon-containing precursor each have the same value for each subsequent deposition cycle. For example, in a first deposition cycle ($C_1$), a time interval ($T_1$) for the pulse of the silicon-containing precursor has the same duration as the time interval ($T_1$) for the pulse of the silicon-containing precursor in subsequent deposition cycles ($C_2 \ldots C_N$). Similarly, the duration of each pulse of the reactant gas and the periods of non-pulsing between the pulse of the silicon-containing precursor and the reactant gas in deposition cycle ($C_1$) is the same as the duration of each pulse of the reactant gas and the periods of non-pulsing between the pulse of the silicon-containing precursor and the reactant gas in subsequent deposition cycles ($C_2 \ldots C_N$), respectively.

Alternatively, the time intervals for at least one pulse of the silicon-containing precursor, the reactant gas and the periods of non-pulsing therebetween for one or more of the deposition cycles of the passivation layer deposition process may have different durations. For such an embodiment, one or more of the time intervals ($T_1$) for the pulses of the silicon-containing precursor, the time intervals ($T_2$) for the pulses of the reactant gas, the time intervals ($T_3$) of non-pulsing between the pulse of the silicon-containing precursor and the pulse of the reactant gas and the time intervals ($T_4$) of non-pulsing between the pulse of the reactant gas and the pulse of the silicon-containing precursor may have different values for one or more subsequent deposition cycles of the passivation layer deposition process. For example, in a first deposition cycle ($C_1$), the time interval ($T_1$) for the pulse of the silicon-containing precursor may be longer or shorter than the time interval ($T_1$) for the pulse of the silicon-containing precursor in a subsequent deposition cycle ($C_2 \ldots C_N$). Similarly, the duration of each pulse of the reactant gas and the periods of non-pulsing between the pulse of the silicon-containing precursor and the reactant gas in deposition cycle ($C_1$) may be the same or different than the duration of each pulse of the reactant gas and the periods of non-pulsing between the pulse of the silicon-containing precursor and the reactant gas in subsequent deposition cycles ($C_2 \ldots C_N$), respectively.

Referring to step 410, after each deposition cycle (steps 404 through 408) a total thickness of the silicon-containing passivation layer will be formed on the substrate. Depending on specific device requirements, subsequent deposition cycles may be needed to achieve a desired thickness. As such, steps 404 through 408 are repeated until the desired thickness for the silicon-containing passivation layer is achieved. Thereafter, when the desired thickness for the silicon-containing passivation layer is achieved the process is stopped as indicated by step 412.

Figure 4:
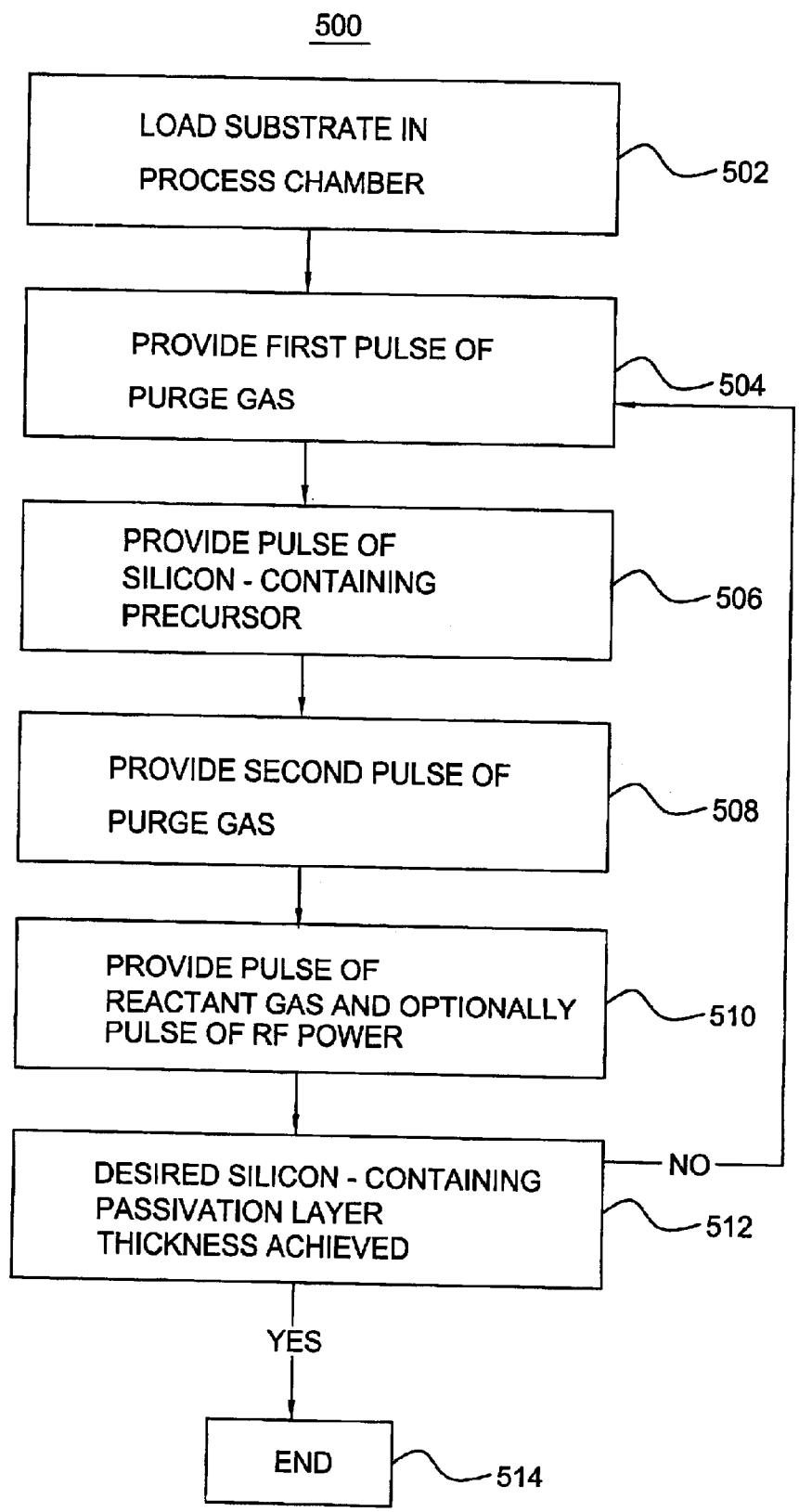
FIG. 4 illustrates a process sequence for passivation layer formation using cyclical deposition techniques according to an alternative embodiment described herein.

In an alternate process sequence described with respect to FIG. 4, the silicon-containing passivation layer deposition cycle comprises separate pulses for each of the silicon-containing precursor, the reactant gas, and the purge gas. For such an embodiment, the silicon-containing passivation layer deposition sequence 500 includes providing a substrate to the process chamber (step 502), providing a first pulse of a purge gas to the process chamber (step 504), providing a pulse of a silicon-containing precursor to the process chamber (step 506), providing a second pulse of the purge gas to the process chamber (step 508), providing a pulse of a reactant gas to the process chamber (step 510), and then repeating steps 504 through 510 or stopping the deposition process (step 514) depending on whether a desired thickness for the silicon-containing passivation layer has been achieved (step 512).

Alternatively, a high frequency power, such as an RF power, may be applied to the substrate support pedestal 348 (FIG. 2) coincident with the pulse of the reactant gas (step 510) to generate a plasma comprising the reactant gas within the process chamber. The plasma is believed to enhance the reaction between the adsorbed silicon-containing precursor on the substrate and the reactant gas. The application of the high frequency power to the substrate support chamber may last for the same predetermined time interval as the time interval for the pulse of the reactant gas. In general, for silicon-containing passivation layer deposition, a high frequency power of about 0.05 W/mm$^2$ to about 2 W/mm$^2$ may be applied to the substrate support pedestal.

The time intervals for each of the pulses of the silicon-containing precursor, the reactant gas and the purge gas may have the same or different durations as discussed above with respect to FIG. 3. Alternatively, the time intervals for at least one pulse of the silicon-containing precursor, the reactant gas and the purge gas for one or more of the deposition cycles of the silicon-containing passivation layer deposition process may have different durations.

In FIGS. 3–4, the silicon-containing passivation layer deposition cycle is depicted as beginning with a pulse of the silicon-containing precursor followed by a pulse of the reactant gas. Alternatively, the silicon-containing passivation layer deposition cycle may start with a pulse of the reactant gas followed by a pulse of the silicon-containing precursor.

One exemplary process of depositing a silicon oxide passivation layer comprises alternately providing pulses of silicon tetrachloride ($SiCl_4$) and pulses of oxygen ($O_2$). The silicon tetrachloride ($SiCl_4$) may be provided to an appropriate flow control valve, for example, an electronic flow control valve, at a flow rate of between about 100 sccm (standard cubic centimeters per minute) and about 200 sccm, and thereafter pulsed for about 2 seconds or less. A carrier gas comprising argon (Ar) is provided along with the silane at a flow rate between about 10 sccm to about 1000 sccm. The oxygen ($O_2$) may be provided to an appropriate flow control valve, for example, an electronic flow control valve, at a flow rate of between about 100 sccm and about 5000 sccm, and thereafter pulsed for about 5 seconds or less. The substrate may be maintained at a chamber pressure between about 0.05 torr to about 10 torr. The substrate may be maintained at a temperature less than about 350° C. The above mentioned flow rates for the carrier gas, the silicon-containing precursor, and the reactant gas may be varied, depending upon the volume capacity of the process chamber 310.

Integrated Circuit Fabrication Processes

1. Bottom-Gate Thin Film Transistor (TFT)

Figure 5A:
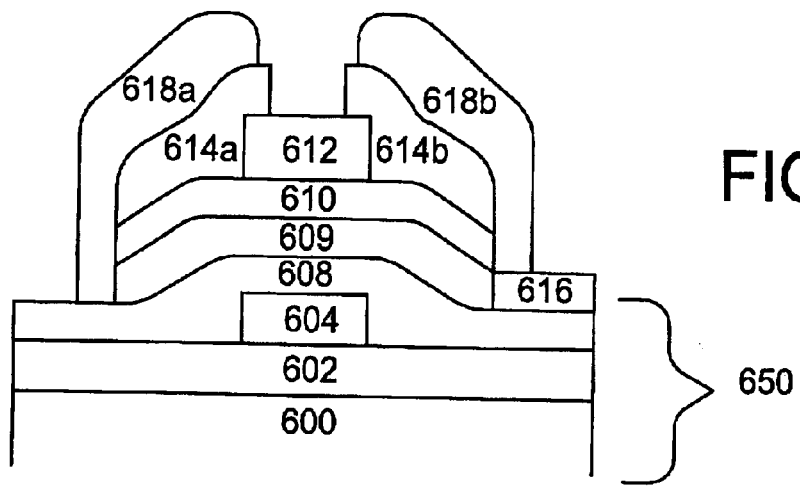
FIGS. 5A–5B depict cross-sectional views of a substrate at different stages of a bottom-gate thin film transistor (TFT) fabrication sequence.
Figure 5B:
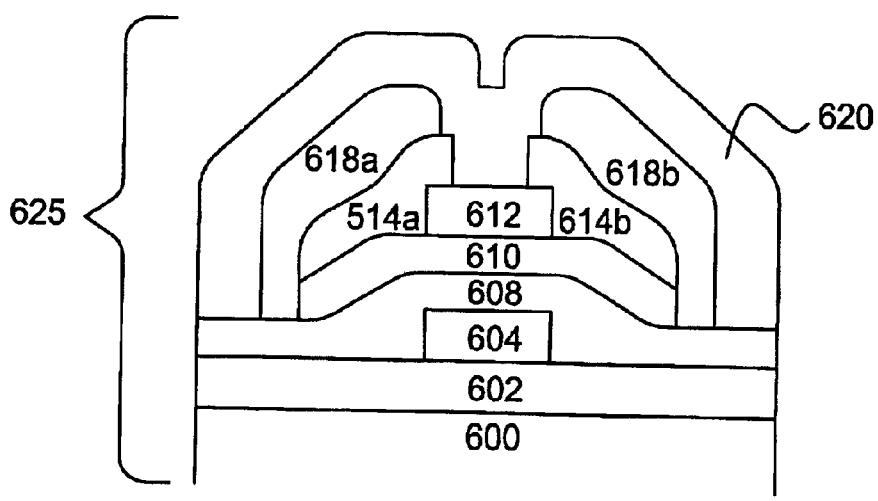

FIGS. 5A–5B illustrate cross-sectional schematic views of substrate structure 650 during different stages of a bottom-gate thin film transistor (TFT) fabrication sequence incorporating a silicon-containing passivation layer formed using a cyclical deposition process. The transistor fabrication sequence is for a switch in an active matrix liquid crystal display (AMLCD) and this process depicts the formation of one of an array of switches used in an AMLCD). FIG. 5A, for example, illustrates a cross-sectional view of a substrate 600. The substrate 600 may comprise a material that is essentially optically transparent in the visible spectrum, such as, for example, glass or clear plastic, including soda-lime glass, borosilicate glass, or quartz glass. The substrate may be of varying shapes or dimensions. Typically, for thin film transistor (TFT) applications, the substrate is a glass substrate with dimensions greater than about 500 mm×500 mm.

The substrate 600 may have an underlayer 602 thereon. The underlayer 602 may be an insulating material, for example, such as silicon dioxide ($SiO_2$) or silicon nitride (SiN). The underlayer 602 may be formed using conventional deposition techniques.

A gate metal layer 604 is formed on the underlayer 602. The gate metal layer 604 comprises an electrically conductive layer that controls the movement of charge carriers within the thin film transistor (TFT). The gate metal layer 604 may comprise a metal such as, for example, aluminum (Al), tungsten (W), chromium (Cr), tantalum (Ta), or combinations thereof, among others. The gate metal layer 604 may be formed using conventional deposition, lithography and etching techniques.

A gate dielectric layer 608 is formed on the gate metal layer 604. The gate dielectric layer 608 may comprise, for example, aluminum oxide ($Al_2O_3$), tantalum oxide ($Ta_2O_5$), among others. Typically the gate dielectric material 608 has a thickness in the range of about 20 Angstroms to about 5000 Angstroms.

A bulk semiconductor layer 610 is formed on the gate dielectric layer 608. Bulk semiconductor layer 610 may be formed using conventional deposition techniques. The bulk semiconductor layer 610 may comprise, for example, amorphous silicon or polycrystalline silicon. Bulk semiconductor layer 610 may be deposited to a thickness within a range of about 20 Angstroms to about 5000 Angstroms.

An etch stop layer 612 may be formed on bulk semiconductor layer 610. The etch stop layer 612 may comprise an insulating material. The etch stop layer 612 may be formed using, for example, plasma enhanced chemical vapor deposition, chemical vapor deposition, physical vapor deposition, or other conventional methods known to the art. The etch stop layer 612 and the bulk semiconductor layer 610 are lithographically patterned and etched using conventional techniques.

A doped semiconductor layer 614 is formed on the patterned etch stop layer 612 and semiconductor bulk layer 610. The doped semiconductor layer 614 may comprise, for example, silicon. The doped semiconductor layer 614 may be deposited to a thickness within a range of about 10 Angstroms to about 100 Angstroms. The doped semiconductor layer 614 directly contacts portions of the bulk semiconductor layer 610, forming a semiconductor junction.

A transparent conductor layer 616 is formed on portions of the gate dielectric layer 608 and the doped semiconductor layer 614. Transparent conductor layer 616 comprises a material that is generally optically transparent in the visible spectrum and is electrically conductive. Transparent conductor layer 616 may comprise, for example, indium tin oxide (ITO), zinc oxide, among others. Transparent conductor layer 616 is lithographically patterned and etched using conventional techniques.

A conductive layer 618 is formed on portions of the doped semiconductor layer 614 and the transparent conductor layer 616. The conductive layer 618 may comprise a metal such as, for example, aluminum (Al), tungsten (W), molybdenum (Mo), chromium (Cr), tantalum (Ta), and combinations thereof, among others. The conductive layer 618 may be formed using conventional deposition techniques.

Both the conductive layer 618 and the doped semiconductor layer 614 may be lithographically patterned to define a source region 614a and a drain region 614b as well as a source contact 618a and a drain contact 618b. The source 614a and drain 614b regions of the thin film transistor (TFT) are separated from one another by the stop etch layer 612.

Referring to FIG. 5B, a silicon-containing passivation layer 620 may be deposited on the substrate structure 650. The silicon-containing passivation layer 620 may comprise, for example, silicon nitride ($Si_3N_4$), silicon oxide (SiO), silicon dioxide ($SiO_2$) among others, deposited using an embodiment of the cyclical deposition technique described above with reference to FIGS. 3–4. Silicon-containing passivation layer 620 may be deposited to a thickness within a range of about 1000 Angstroms to about 5000 Angstroms. The cyclical deposition techniques employed for the passivation bulk layer 620 deposition provide conformal step coverage on exposed surfaces of gate dielectric layer 608, source contact 618a, drain contact 618b, etch stop layer 612 and transparent conductor 616.

2. Top-Gate Thin Film Transistor (TFT)

Figure 6A:
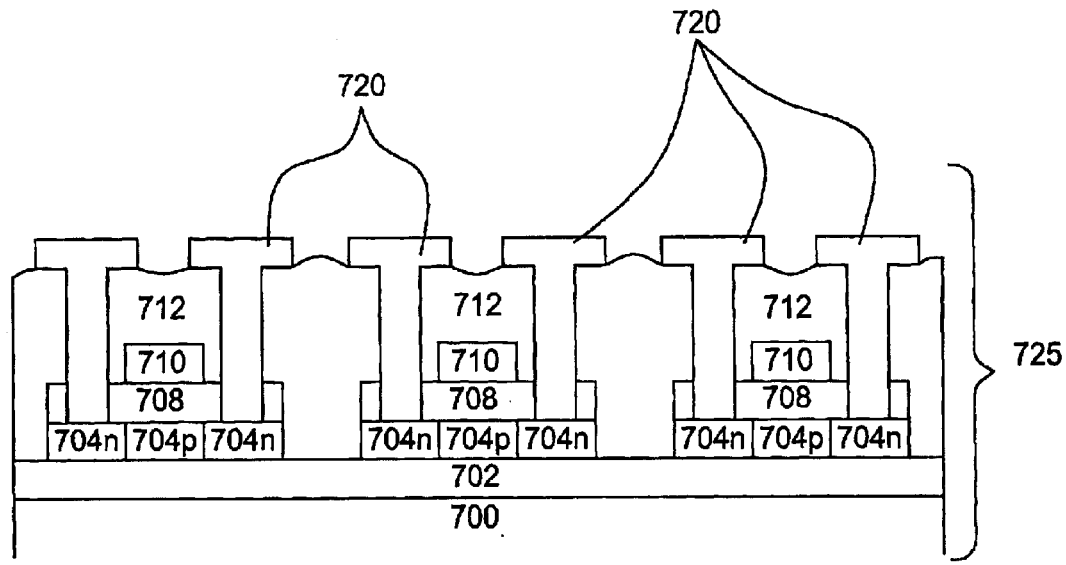
FIGS. 6A–6B depict cross-sectional views of a substrate at different stages of a top-gate thin film transistor (TFT) fabrication sequence.
Figure 6B:
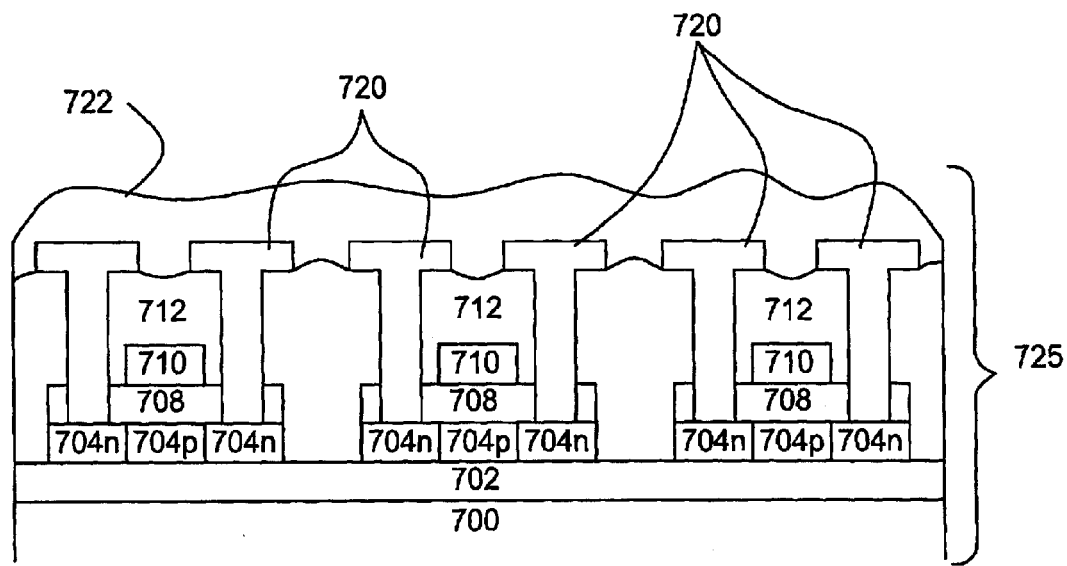

FIGS. 6A–6B illustrate cross-sectional schematic views of substrate structure 750 during different stages of a top-gate thin film transistor (TFT) fabrication sequence incorporating a silicon-containing passivation layer formed using a cyclical deposition process. The top-gate thin film transistor (TFT) may be, for example, a metal-oxide-semiconductor field effect transistor (MOSFET) or a junction field effect transistor (JFET). This transistor fabrication sequence is for a switch in an active matrix liquid crystal display (AMLCD) and this process depicts the formation of one of an array of switches used in an AMLCD.

FIG. 6A, for example, illustrates a cross-sectional view of a substrate 700. The substrate may comprise a material that is essentially optically transparent in the visible spectrum, such as, for example, glass or clear plastic, including soda-lime glass, borosilicate glass, or quartz. The substrate may have an underlayer 702 thereon. The underlayer 702 may be an insulating material, such as, for example, silicon dioxide ($SiO_2$) or silicon nitride (SiN).

A doped semiconductor layer 704 is deposited on the underlayer 702. The doped semiconductor layer 704 may comprise silicon. The doped semiconductor layer 704 includes n-type doped regions 704n and p-type doped regions 704p. The interfaces between n-type doped regions 704n and p-type doped regions 704p are semiconductor junctions that support the ability of the thin film transistor (TFT) to act as a switching device.

A gate dielectric layer 708 is deposited on the n-type doped regions 704n and the p-type doped regions 704p. The gate dielectric layer 708 may comprise, for example, aluminum oxide ($Al_2O_3$), and tantalum pentoxide ($Ta_2O_5$), among others. The gate dielectric layer 708 may be formed using conventional deposition processes.

A gate metal layer 710 is deposited on the gate dielectric layer 708. The gate metal layer 710 comprises an electrically conductive layer that controls the movement of charge carriers within the thin film transistor (TFT). The gate metal layer 710 may comprise a metal such as, for example, aluminum (Al), tungsten (W), molybdenum (Mo), chromium (Cr), tantalum (Ta), or combinations thereof, among others. The gate metal layer 710 may be formed using conventional deposition techniques. After deposition the gate metal layer 710 is patterned to define gates using conventional lithography and etching techniques.

After the gate metal layer 710 is patterned, an interlayer dielectric 712 is formed thereon. The interlayer dielectric 712 may comprise, for example, an oxide. Interlayer dielectric 712 may be formed using conventional deposition processes.

The interlayer dielectric 712 is patterned to expose the n-type doped regions 704n and the p-type doped regions 704p. The patterned regions of the interlayer dielectric 712 are filled with a conductive material to form contacts 720. The contacts 720 may comprise a metal such as, for example, aluminum (Al), tungsten (W), molybdenum (Mo), chromium (Cr), tantalum (Ta), and combinations thereof, among others. The contacts 720 may be formed using conventional deposition techniques.

Thereafter, a silicon-containing passivation layer 722 may be formed thereon in order to protect and encapsulate a completed thin film transistor 725. The silicon-containing passivation layer 722 may be formed using an embodiment of the cyclical deposition process described above with reference to FIGS. 3–4. The silicon-containing passivation layer 722 may comprise, for example, silicon nitride ($Si_3N_4$), silicon oxide (SiO), and silicon dioxide ($SiO_2$), among others. The silicon-containing passivation layer 722 may be deposited to a thickness within a range of about 1000 Angstroms to about 5000 Angstroms.

Silicon-containing passivation layers such as those described with reference to FIGS. 5–6 that are deposited using a cyclical deposition method described above provide excellent step coverage and are less likely to form defects that lead to device failure. Thin film transistors incorporating silicon-containing passivation layers deposited using embodiments described herein provide also provide excellent protection of the thin film transistor from environmental hazards such as moisture and oxygen.

Furthermore, it is within the scope of the invention to form other devices that have configurations of semiconductor layers that are different from those described in FIGS. 5–6. For example, the switch for an AMLCD may be any variety of bipolar or unipolar transistor devices wherein a passivation layer is deposited using the cyclical deposition process described herein.

While the foregoing is directed to the preferred embodiments of the present invention, other and further embodiments of the invention may be devised without departing from the basic scope thereof, and the scope thereof is determined by the claims that follow.

What is claimed is:

1. A method of forming a silicon-containing passivation layer on a substrate, wherein the substrate is used in active matrix liquid crystal display, comprising:
    providing a substrate; and
    depositing a silicon-containing passivation layer on the substrate using a cyclical deposition process comprising a plurality of cycles, wherein each cycle comprises establishing a flow of an inert gas to a process chamber and modulating the flow of the inert gas with an alternating period of exposure to one of either a silicon-containing precursor and a reactant gas.

2. The method of claim 1 wherein the period of exposure to the silicon-containing precursor, the period of exposure to the reactant gas, a period of flow of the inert gas between the period of exposure to the silicon-containing precursor and the period of exposure to the reactant gas, and a period of flow of the inert gas between the period of exposure to the reactant gas and the period of exposure to the silicon-containing precursor each have the same duration.

3. The method of claim 1 wherein at least one of the period of exposure to the silicon-containing precursor, the period of exposure to the reactant gas, a period of flow of the inert gas between the period of exposure to the silicon-containing precursor and the period of exposure to the reactant gas, and a period of flow of the inert gas between the period of exposure to the reactant gas and the period of exposure to the silicon-containing precursor has a different duration.

4. The method of claim 1 wherein the period of exposure to the silicon-containing precursor during each deposition cycle of the cyclical deposition process has the same duration.

5. The method of claim 1 wherein at least one period of exposure to the silicon-containing precursor for one or more deposition cycles of the cyclical deposition process has a different duration.

6. The method of claim 1 wherein the period of exposure to the reactant gas during each deposition cycle of the cyclical deposition process has the same duration.

7. The method of claim 1 wherein at least one period of exposure to the reactant gas for one or more deposition cycles of the cyclical deposition process has a different duration.

8. The method of claim 1 wherein a period of flow of the inert gas between the period of exposure to the silicon-containing precursor and the period of exposure to the reactant gas during each deposition cycle of the cyclical deposition process has the same duration.

9. The method of claim 1 wherein at least one period of flow of the inert gas between the period of exposure to the silicon-containing precursor and the period of exposure to the reactant gas for one or more deposition cycles of the cyclical deposition process has a different duration.

10. The method of claim 1 wherein a period of flow of the inert gas between the period of exposure to the reactant gas and the period of exposure to the silicon-containing precursor during each deposition cycle of the cyclical deposition process has the same duration.

11. The method of claim 1 wherein at least one period of flow of the inert gas between the period of exposure to the reactant gas and the period of exposure to the silicon-containing precursor for one or more deposition cycles of the cyclical deposition process has a different duration.

12. The method of claim 1 wherein the silicon-containing precursor comprises a compound selected from the group consisting of silane, disilane, hexachlorodisilane silicon tetrachloride, dichlorosilane and trichlorosilane.

13. The method of claim 1 wherein the reactant gas comprises one or more compound selected from the group consisting of ammonia, hydrazine, nitrogen, oxygen, ozone, hydrogen and water vapor.

14. The method of claim 1 wherein the reactant gas comprises a plasma.

* * * * *

UNITED STATES PATENT AND TRADEMARK OFFICE
CERTIFICATE OF CORRECTION

PATENT NO.       : 6,869,838 B2
APPLICATION NO.  : 10/118864
DATED            : March 22, 2005
INVENTOR(S)      : Law et al.

It is certified that error appears in the above-identified patent and that said Letters Patent is hereby corrected as shown below:

Please Insert in Section (56) References Cited:

FOREIGN PATENT DOCUMENTS

| | | |
|---|---|---|
| DE 196 27 017 A1 | 1/9/97 | KABUSHIKI KAISHA TOSHIBA |
| DE 198 20 147 A1 | 7/1/99 | SAMSUNG ELECTRONCS CO., LTD. |
| EP 0 344 352 A1 | 12/6/89 | INTERNATIONAL BUSINESS MACHINES CORP. |
| EP 0 429 270 A2 | 5/29/91 | KOSKUSAI ELECTRIC CO. |
| EP 0 442 290 A1 | 8/21/91 | AMAZONEN-WERKE H. DREYER GmbH & CO. |
| EP 0 799 641 A2 | 10/8/97 | MIKROKEMIA OY |
| FR 2 626 110 | 7/21/89 | THOMSON-CSF |
| FR 2 692 597 | 12/24/93 | MIKROKEMIA OY |
| GB 2 355 727 A | 5/02/01 | SAMSUNG ELECTRONICS CO., LTD. |
| JP 01-103982 | 4/21/89 | NEC CORP |
| JP 01-103996 | 4/21/89 | NEC CORP |
| JP 01-117017 | 5/9/89 | FUJITSU LTD |
| JP 01-143221 | 6/5/89 | NEC CORP |
| JP 01-143233 (Abstract Only) | 6/5/89 | NEC CORP |
| JP 01-154511 | 6/16/89 | HITACHI LTD |

UNITED STATES PATENT AND TRADEMARK OFFICE
CERTIFICATE OF CORRECTION

PATENT NO.        : 6,869,838 B2
APPLICATION NO. : 10/118864
DATED                  : March 22, 2005
INVENTOR(S)        : Law et al.

It is certified that error appears in the above-identified patent and that said Letters Patent is hereby corrected as shown below:

| | | |
|---|---|---|
| JP 01-236657 | 9/21/89 | TOKYO SHIBAURA ELECTRIC CO (JP) |
| JP 01-245512 | 9/29/89 | NIPPON TELEGR & TELEPH CORP |
| JP 01-264218 (Abstract Only) | 10/20/89 | FUJITSU LTD |
| JP 01-270593 | 10/27/89 | FUJITSU LTD |
| JP 01-272108 | 10/31/89 | NIPPON TELEGR & TELEPH CORP |
| JP 01-290221 | 11/22/89 | FUJITSU LTD |
| JP 01-290222 | 11/22/89 | FUJITSU LTD |
| JP 01-296673 | 11/30/89 | NEC CORP |
| JP 01-303770 | 12/7/89 | OKI ELECTRIC IND CO LTD |
| JP 01-305894 | 12/11/89 | MATSUSHITA ELECTRIC IND CO LTD |
| JP 01-313927 | 12/19/89 | FUJITSU LTD |
| JP 02-012814 (Abstract Only) | 1/17/90 | FUJITSU LTD |
| JP 02-014513 (Abstract Only) | 1/18/90 | FUJITSU LTD |
| JP 02-017634 | 1/22/90 | MATSUSHITA ELECTRIC IND CO LTD |
| JP 02-063115 | 3/2/90 | NEC CORP |
| JP 02-074029 | 3/14/90 | FUJITSU LTD |
| JP 02-074587 | 3/14/90 | FUJITSU LTD |
| JP 02-106822 | 4/18/90 | HITACHI LTD |

UNITED STATES PATENT AND TRADEMARK OFFICE
CERTIFICATE OF CORRECTION

PATENT NO. : 6,869,838 B2
APPLICATION NO. : 10/118864
DATED : March 22, 2005
INVENTOR(S) : Law et al.

It is certified that error appears in the above-identified patent and that said Letters Patent is hereby corrected as shown below:

| | | |
|---|---|---|
| JP 02-129913 | 5/18/90 | FUJITSU LTD |
| JP 02-162717 | 6/22/90 | FUJITSU LTD |
| JP 02-172895 | 7/4/90 | NEC CORP |
| JP 02-196092 | 8/2/90 | SUMITOMO ELECTRIC IND LTD |
| JP 02-203517 (Abstract Only) | 8/13/90 | NEC CORP |
| JP 02-230690 | 9/13/90 | FUJITSU LTD |
| JP 02-230722 | 9/13/90 | NEC CORP |
| JP 02-246161 | 10/1/90 | FUJITSU LTD |
| JP 02-264491 | 10/29/90 | MITSUBISHI ELECTRIC CORP |
| JP 02-283084 | 11/20/90 | FUJITSU LTD |
| JP 02-304916 | 12/18/90 | NEC CORP |
| JP 03-019211 | 1/28/91 | FUJITSU LTD |
| JP 03-022569 | 1/30/91 | FUJITSU LTD |
| JP 03-023294 | 1/31/91 | FUJITSU LTD |
| JP 03-023299 | 1/31/91 | FUJITSU LTD |
| JP 03-044967 | 2/26/91 | FUJITSU LTD |
| JP 03-048421 | 3/1/91 | TOKYO ELECTRON LTD |
| JP 03-070124 | 3/26/91 | FUJITSU LTD |
| JP 03-185716 | 8/13/91 | FUJITSU LTD |

UNITED STATES PATENT AND TRADEMARK OFFICE
CERTIFICATE OF CORRECTION

PATENT NO. : 6,869,838 B2
APPLICATION NO. : 10/118864
DATED : March 22, 2005
INVENTOR(S) : Law et al.

It is certified that error appears in the above-identified patent and that said Letters Patent is hereby corrected as shown below:

| | | |
|---|---|---|
| JP 03-208885 | 9/12/91 | TDK CORP |
| JP 03-234025 | 10/18/91 | FUJITSU LTD |
| JP 03-286522 | 12/17/91 | NEC CORP |
| JP 03-286531 | 12/17/91 | KAWASAKI STEEL CO. |
| JP 04-031391 | 2/3/92 | NEC CORP |
| JP 04-031396 | 2/3/92 | FUJITSU LTD |
| JP 04-100292 | 4/2/92 | FUJITSU LTD |
| JP 04-111418 | 4/13/92 | NIPPON TELEGR & TELEPH CORP |
| JP 04-132214 | 5/6/92 | NIPPON TELEGR & TELEPH CORP |
| JP 04-132681 | 5/6/92 | SUMITOMO ELECTRIC IND LTD |
| JP 04-151822 | 5/25/92 | TOSHIBA CORP |
| JP 04-162418 | 6/5/92 | FUJITSU LTD |
| JP 04-175299 | 6/23/92 | FUJITSU LTD |
| JP 04-186824 | 7/3/92 | FUJITSU LTD |
| JP 04-212411 | 8/4/92 | NEC CORP |
| JP 04-260696 | 9/16/92 | FUJITSU LTD |
| JP 04-273120 | 9/29/92 | NEC CORP |
| JP 04-285167 | 10/9/92 | RAIMZU:KK |
| JP 04-291916 | 10/16/92 | KOKUSAI ELECTRIC CO LTD |

UNITED STATES PATENT AND TRADEMARK OFFICE
CERTIFICATE OF CORRECTION

| | |
|---|---|
| PATENT NO. | : 6,869,838 B2 |
| APPLICATION NO. | : 10/118864 |
| DATED | : March 22, 2005 |
| INVENTOR(S) | : Law et al. |

It is certified that error appears in the above-identified patent and that said Letters Patent is hereby corrected as shown below:

| | | |
|---|---|---|
| JP 04-325500 | 11/13/92 | SANYO ELECTRIC CO LTD |
| JP 04-328874 | 11/17/92 | SANYO ELECTRIC CO LTD |
| JP 05-029228 | 2/5/93 | NIPPON TELEGR & TELEPH CORP |
| JP 05-047665 | 2/26/93 | FUJITSU LTD |
| JP 05-047666 | 2/26/93 | FUJITSU LTD |
| JP 05-047668 | 2/26/93 | FUJITSU LTD |
| JP 05-074717 | 3/26/93 | FUJITSU LTD |
| JP 05-074724 | 3/26/93 | TOPPAN PRINTING CO LTD |
| JP 05-102189 | 4/23/93 | FUJITSU LTD |
| JP 05-160152 | 6/25/93 | FUJITSU LTD |
| JP 05-175143 | 7/13/93 | FUJITSU LTD |
| JP 05-175145 | 7/13/93 | FUJITSU LTD |
| JP 05-182906 | 7/23/93 | SUMITOMO ELECTRIC IND LTD |
| JP 05-186295 | 7/27/93 | FUJITSU LTD |
| JP 05-206036 | 8/13/93 | RIKAGAKU KENKYUSHO |
| JP 05-234899 | 9/10/93 | HITACHI LTD |
| JP 05-235047 | 9/10/93 | NEC CORP |
| JP 05-251339 | 9/28/93 | FUJITSU LTD |
| JP 05-270997 | 10/19/93 | FUJITSU LTD |
| JP 05-283336 | 10/29/93 | NEC CORP |

UNITED STATES PATENT AND TRADEMARK OFFICE
CERTIFICATE OF CORRECTION

PATENT NO. : 6,869,838 B2
APPLICATION NO. : 10/118864
DATED : March 22, 2005
INVENTOR(S) : Law et al.

It is certified that error appears in the above-identified patent and that said Letters Patent is hereby corrected as shown below:

| | | |
|---|---|---|
| JP 05-291152 | 11/5/93 | HITACHI LTD |
| JP 05-304334 | 11/16/93 | NEC CORP |
| JP 05-343327 | 12/24/93 | FUJITSU LTD |
| JP 05-343685 | 12/24/93 | FUJITSU LTD |
| JP 06-045606 | 2/18/94 | FUJITSU LTD |
| JP 06-132236 | 5/13/94 | FUJITSU LTD |
| JP 06-177381 | 6/24/94 | FUJITSU LTD |
| JP 06-196609 | 7/15/94 | MITSUBISHI ELECTRIC CORP. |
| JP 06-222388 | 8/12/94 | FUJITSU LTD |
| JP 06-224138 | 8/12/94 | TEXAS INSTRUMENTS INC |
| JP 06-230421 | 8/19/94 | FUJITSU LTD |
| JP 06-252057 | 9/9/94 | TOSHIBA CORP |
| JP 06-291048 | 10/18/94 | NISSIN ELECTRIC CO LTD |
| JP 07-070752 | 3/14/95 | KOKUSAI CHODENDO SANGYO GIJUTSU KENKYU CENTER |
| JP 07-086269 | 3/31/95 | FUJITSU LTD |
| JP 08-181076 | 7/12/96 | FUJI XEROX CO LTD |
| JP 08-245291 | 9/24/96 | SUMITOMO ELECTRIC IND LTD |
| JP 08-264530 | 10/11/96 | FUJITSU LTD |

UNITED STATES PATENT AND TRADEMARK OFFICE
CERTIFICATE OF CORRECTION

PATENT NO. : 6,869,838 B2
APPLICATION NO. : 10/118864
DATED : March 22, 2005
INVENTOR(S) : Law et al.

It is certified that error appears in the above-identified patent and that said Letters Patent is hereby corrected as shown below:

| | | |
|---|---|---|
| JP 09-260786 | 10/3/97 | HITACHI LTD |
| JP 09-293681 | 11/11/97 | SHARP CORP |
| JP 10-188840 | 7/21/99 | |
| JP 10-190128 | 7/21/98 | SONY CORP |
| JP 10-308283 | 11/17/98 | DENSO CORP |
| JP 11-269652 (Abstract Only) | 10/5/99 | SAMSUNG ELECTRONICS CO LTD |
| JP 2000-031387 | 1/28/00 | FUJI ELECTRIC CO LTD |
| JP 2000-058777 | 2/25/00 | SAMSUNG ELECTRONICS CO LTD |
| JP 2000-068072 | 3/3/00 | PLANAR SYSTEMS |
| JP 2000-087029 | 3/28/00 | PLANAR SYSTEMS |
| JP 2000-138094 | 5/16/00 | KOREA ELECTRONICS TELECOMMUN |
| JP 2000-218445 | 8/8/00 | AGENCY OF IND SCIENCE & TECHNOL |
| JP 2000-319772 (Abstract Only) | 11/21/00 | P K LTD |
| JP 2000-340883 | 12/8/00 | FUJITSU LTD |
| JP 2000-353666 | 12/19/00 | MATSUSHITA ELECTRIC IND CO LTD |
| JP 2001-020075 (Abstract Only) | 1/23/01 | ASM MICROCHEMISTRY OY |
| JP 2001-062244 (Abstract Only) | 3/13/01 | ASM MICROCHEMISTRY OY |

UNITED STATES PATENT AND TRADEMARK OFFICE
CERTIFICATE OF CORRECTION

PATENT NO. : 6,869,838 B2
APPLICATION NO. : 10/118864
DATED : March 22, 2005
INVENTOR(S) : Law et al.

It is certified that error appears in the above-identified patent and that said Letters Patent is hereby corrected as shown below:

| | | |
|---|---|---|
| JP 2001-152339 (Abstract Only) | 6/5/01 | SAMSUNG ELECTRONICS CO LTD |
| JP 2001-172767 | 6/26/01 | ASM MICROCHEMISTRY OY |
| JP 2001-189312 | 7/10/01 | MOTOROLA, INC. |
| JP 2001-217206 | 8/10/01 | SAMSUNG ELECTRONICS CO LTD |
| JP 2001-220287 | 8/14/01 | DENSO CORP |
| JP 2001-220294 | 8/14/01 | DENSO CORP |
| JP 2001-240972 | 9/4/01 | DENSO CORP |
| JP 2001-254181 | 9/18/01 | TOKYO ELECTRON LTD |
| JP 2001-284042 | 10/12/01 | |
| JP 2001-303251 | 10/31/01 | |
| JP 2001-328900 | 11/27/01 | DENSO CORP |
| JP 58-098917 | 6/13/83 | MATSUSHITA ELECTRIC IND CO LTD |
| JP 58-100419 | 6/15/83 | SUWA SEIKOSHA KK |
| JP 60-065712 A | 4/15/85 | TOSHIBA KK |
| JP 61-035847 | 2/20/86 | HITACHI LTD |
| JP 61-210623 | 9/18/86 | SONY CORP |
| JP 62-069508 | 3/30/87 | SUMITOMO ELECTRIC IND LTD |
| JP 62-091495 | 4/25/87 | NEC CORP |

UNITED STATES PATENT AND TRADEMARK OFFICE
CERTIFICATE OF CORRECTION

PATENT NO. : 6,869,838 B2
APPLICATION NO. : 10/118864
DATED : March 22, 2005
INVENTOR(S) : Law et al.

It is certified that error appears in the above-identified patent and that said Letters Patent is hereby corrected as shown below:

| | | |
|---|---|---|
| JP 62-141717 | 6/25/87 | FUJITSU LTD |
| JP 62-167297 | 7/23/87 | NEC CORP |
| JP 62-171999 | 7/28/87 | NIPPON TELEGR & TELEPH CORP |
| JP 62-232919 | 10/13/87 | RIKAGAKU KENKYUSHO |
| JP 63-062313 | 3/18/88 | FUJITSU LTD |
| JP 63-085098 | 4/15/88 | NEC CORP |
| JP 63-090833 (Abstract Only) | 4/21/88 | NEC CORP |
| JP 63-222420 | 9/16/88 | NEC CORP |
| JP 63-222421 | 9/16/88 | NEC CORP |
| JP 63-227007 | 9/21/88 | MATSUSHITA ELECTRIC IND CO LTD |
| JP 63-252420 | 10/19/88 | NEC CORP |
| JP 63-266814 | 11/2/88 | NEC CORP |
| JP 64-009895 | 1/13/89 | MATSUMOTO TAKU |
| JP 64-009896 | 1/13/89 | MATSUMOTO TAKU |
| JP 64-009897 | 1/13/89 | MATSUMOTO TAKU |
| JP 64-037832 (Abstract Only) | 2/8/89 | FUJITSU LTD |
| JP 64-082615 | 3/28/89 | NEC CORP |
| JP 64-082617 | 3/28/89 | NEC CORP |
| JP 64-082671 | 3/28/89 | NEC CORP |
| JP 64-082676 | 3/28/89 | NEC CORP |

UNITED STATES PATENT AND TRADEMARK OFFICE
CERTIFICATE OF CORRECTION

PATENT NO. : 6,869,838 B2
APPLICATION NO. : 10/118864
DATED : March 22, 2005
INVENTOR(S) : Law et al.

It is certified that error appears in the above-identified patent and that said Letters Patent is hereby corrected as shown below:

| | | |
|---|---|---|
| JP 64-090524 (Abstract Only) | 4/7/89 | NEC CORP |
| WO 90/02216 | 3/8/90 | VAC-TEC SYSTEMS, INC. |
| WO 91/10510 | 7/25/91 | NESTE OY |
| WO 93/02111 | 2/4/93 | NESTE OY |
| WO 96/17107 | 6/6/96 | MIKROKEMIA OY |
| WO 96/18756 | 6/20/96 | NKT RESEARCH CENTER |
| WO 98/06889 | 2/19/98 | FORWARD TECHNOLOGY INDUSTRIES, INC. |
| WO 98/51838 | 11/19/98 | APPLIED MATERIALS, INC. |
| WO 99/13504 | 3/18/99 | TOKYO ELECTRON LTD |
| WO 99/29924 | 6/17/99 | NESTE OYJ |
| WO 99/41423 | 8/19/99 | APPLIED MATERIALS, INC. |
| WO 00/11721 | 3/2/00 | U.S. NAVY |
| WO 00/15865 | 3/23/00 | ASM MICROCHEMISTRY LTD |
| WO 00/15881 A2 | 3/23/00 | GENITECH CO., LTD |
| WO 00/16377 A2 | 3/23/00 | GENITECH CO., LTD |
| WO 00/54320 A1 | 9/14/00 | GENUS, INC. |
| WO 00/63957 A1 | 10/26/00 | GENITECH, INC. |
| WO 00/79019 A1 | 12/28/00 | GADGIL, PRASAD, NARHAR |
| WO 00/79576 A1 | 12/28/00 | GENITECH, INC. |
| WO 01/15220 | 3/1/01 | ASTRA AKTIEBOLAG |

UNITED STATES PATENT AND TRADEMARK OFFICE
CERTIFICATE OF CORRECTION

PATENT NO. : 6,869,838 B2
APPLICATION NO. : 10/118864
DATED : March 22, 2005
INVENTOR(S) : Law et al.

It is certified that error appears in the above-identified patent and that said Letters Patent is hereby corrected as shown below:

| | | |
|---|---|---|
| WO 01/27346 A1 | 4/19/01 | ASM MICROCHEMISTRY OY |
| WO 01/27347 A1 | 4/19/01 | ASM MICROCHEMISTRY OY |
| WO 01/29280 A1 | 4/26/01 | ASM AMERICA, INC. |
| WO 01/29891 A1 | 4/26/01 | ASM AMERICA, INC. |
| WO 01/29893 A1 | 4/26/01 | ASM AMERICA, INC. |
| WO 01/36702 A1 | 5/25/01 | AVANEX CORPORATION |
| WO 01/40541 A1 | 6/7/01 | ASM MICROCHEMISTRY OY |
| WO 01/66832 A1 | 9/13/01 | ASM AMERICA, INC. |

NON PATENT LITERATURE DOCUMENTS

Bader, et al., "Integrated Processing Equipment", Solid State Technology, Cowan Pub., Vol. 33, No. 5 (May 1,1990), pp. 149-154

Bedair, "Atomic layer epitaxy deposition processes", *J. Vac. Sci. Techol.* 12(1) (Jan/Feb 1994)

Choi, et al., "Stability of $TiB_2$ as a Diffusion Barrier on Silicon", J. Electrochem. Soc. 138(10) (October 1991), pp. 3062-3067

Choi, et al., "The effect of annealing on resistivity of low pressure chemical vapor deposited titanium diboride", J. Appl. Phys. 69(11) (June 1, 1991), pp. 7853-7861

Derbyshire, "Applications of Integrated processing", Solid State Technology, US, Cowan Pub., Vol 37, No.12 (December 1,1994), pp. 45-47

UNITED STATES PATENT AND TRADEMARK OFFICE
CERTIFICATE OF CORRECTION

PATENT NO. : 6,869,838 B2
APPLICATION NO. : 10/118864
DATED : March 22, 2005
INVENTOR(S) : Law et al.

It is certified that error appears in the above-identified patent and that said Letters Patent is hereby corrected as shown below:

Elers, at al., "NbCl$_5$ as a precursor in atomic layer epitaxy", *Appl. Surf. Sci.*, Vol. 82/83 (1994), pp. 468-474

George, et al., "Atomic layer controlled deposition of SiO$_2$ and Al$_2$O$_3$ using ABAB...binary reaction sequence chemistry", *Appl. Surf. Sci.*, Vol. 82/83 (1994), pp. 460-467

George, et al., "Surface Chemistry for Atomic Layer Growth", *J. Phys. Chem.*, Vol. 100 (1996), pp. 13121-131

Hultman, et al., "Review of the thermal and mechanical stability of TiN-based thin films", *Zeitschrift Fur Metallkunde*, 90(10) (Oct. 1999), pp. 803-813

IBM Tech. Disc. Bull. "Knowledge-Based Dynamic Scheduler in Distributed Computer Control, (June 1990), pp. 80-84

IBM Tech. Disc. Bull. "Multiprocessor and Multitasking Architecture for Tool Control of the Advanced via Inspection Tools" (May 1992), pp. 190-191

Kitagawa, et al., "Hydrogen-mediated low temperature epitaxy of Si in plasma-enhanced chemical vapor deposition", Applied Surface Science (2000), pp. 30-34

Klaus, et al., "Atomic Layer Deposition of SiO$_2$ Using Catalyzed and Uncatalyzed Self-Limiting Surface Reactions", *Surface Review & Letters*, 6(3&4) (1999), pp. 435-448

Klaus, et al., "Atomically controlled growth of tungsten and tungsten nitride using sequential surface reactions". *Appl. Surf. Sci.*, Vol 162-163 (July 1999), pp. 479-491

Lee, "The Preparation of Titanium-Based Thin Film by CVD Using Titanium Chlorides as precursors", *Chemical Vapor Deposition*, 5(2) (Mar. 1999), pp. 69-73

UNITED STATES PATENT AND TRADEMARK OFFICE
CERTIFICATE OF CORRECTION

PATENT NO. : 6,869,838 B2
APPLICATION NO. : 10/118864
DATED : March 22, 2005
INVENTOR(S) : Law et al.

It is certified that error appears in the above-identified patent and that said Letters Patent is hereby corrected as shown below:

Lee, et al., "Pulsed nucleation for ultra-high aspect ratio tungsten plugfill", Novellus Systems, Inc. (2001), pp. 1-2

Maertensson, et al., "Atomic Layer Epitaxy of Copper on Tantalum", *Chemical Vapor Deposition*, 3(1) (Feb. 1,1997), pp. 45-50

Martensson, et al., "Atomic Layer Epitaxy of Copper, Growth & Selectivity in the Cu (II)-2,2.6,6-Tetramethyl-3, 5-Heptanedion ATE/$H_2$ Process", *J. Electrochem. Soc.*, 145(8) (Aug. 1998), pp. 2926-2931

Maydan, "Cluster Tools for Fabrication of Advanced devices" Jap. J. of Applied Physics, Extended Abstracts, 22$^{nd}$ Conference Solid State Devices and Materials (1990), pp. 849 – 852 XP000178141

McGeachin, S., "Synthesis and properties of some β-diketimines derived from acetylacetone, and their metal complexes", Canadian J. of Chemistry, Vol. 46 (1968), pp.1903-1912

Min, et al., "Atomic layer deposition of TiN thin films by sequential introduction of Ti precursor and $NH_3$", *Symp.: Advanced Interconnects and Contact Materials and Processes for Future Integrated Circuits* (Apr. 13-16, 1998), pp. 337-342

Min, et al., "Metal-Organic Atomic-Layer Deposition of Titanium-Silicon-Nitride Films", *Applied Physics Letters*, American Inst. of Physics, Vol 75(11) (Sept. 13, 1999)

Min, et al., "Chemical Vapor Deposition of Ti-Si-N Films with Alternating Source Supply", *Mat, Res. Soc. Symp. Proc.*, Vol. 564 (Apr. 5,1999), pp. 207-210

Niinisto, et al., "Synthesis of oxide thin films and overlayers by atomic layer epitaxy for advanced applications", *Mat. Sci. & Eng.*, Vol. B41 (1996), pp. 23-29

UNITED STATES PATENT AND TRADEMARK OFFICE
CERTIFICATE OF CORRECTION

PATENT NO.       : 6,869,838 B2
APPLICATION NO.  : 10/118864
DATED            : March 22, 2005
INVENTOR(S)      : Law et al.

It is certified that error appears in the above-identified patent and that said Letters Patent is hereby corrected as shown below:

Ohba, et al., "Thermal Decomposition of Methylhydrazine and Deposition Properties of CVD TiN Thin Films", Conference Proceedings, Advanced Metallization for ULSI Applications in 1993 (1994), pp. 143-149

Ritala, et al. "Atomic Layer Epitaxy Growth of TiN Thin Films", *J. Electrochem. Soc.*, 142(8) (Aug. 1995), pp. 2731-737

Ritala, et al., "Perfectly conformal TiN and $Al_2O_3$ films deposited by atomic layer deposition", *Chemical Vapor Deposition*, Vol. 5(1) (January 1999), pp. 7-9

Scheper, et al., "Low-temperature deposition of titanium nitride films from dialkylhydrazine-based precursors", Materials Science in Semiconductor Processing 2 (1999), pp. 149-157

Solanki, et al., "Atomic Layer deposition of Copper Seed Layers", Electrochemical and Solid State Letters, 3(10) (2000), pp. 479-480

Suzuki, et al., "A 0.2-µm contact filling by 450°C-hydrazine-reduced TiN film with low resistivity", IEDM 92-979, pp. 11.8.1–11.8.3

Suzuki, et al., "LPCVD-TiN Using Hydrazine and $TiCl_4$", VMIC Conference (June 8-9, 1993), pp. 418-423

Wise, et al., "Diethyldiethoxysilane as a new precursor for $SiO_2$ growth on silicon", *Mat. Res. Soc. Symp. Proc.*, Vol. 334 (1994), pp. 37-43

Yamaga, et al., "Atomic layer epitaxy of ZnS by a new gas supplying system in a low-pressure metalorganic vapor phase epitaxy", *J. of Crystal Growth* 117 (1992), pp. 152-155

UNITED STATES PATENT AND TRADEMARK OFFICE
CERTIFICATE OF CORRECTION

PATENT NO. : 6,869,838 B2
APPLICATION NO. : 10/118864
DATED : March 22, 2005
INVENTOR(S) : Law et al.

It is certified that error appears in the above-identified patent and that said Letters Patent is hereby corrected as shown below:

Yamaguchi, et al., "Atomic-layer chemical-vapor-deposition of silicon dioxide films with extremely low hydrogen content", *Appl. Surf. Sci.*, Vol. 130-132 (1998), pp. 202-207

Signed and Sealed this

Twenty-second Day of May, 2007

JON W. DUDAS
*Director of the United States Patent and Trademark Office*